United States Patent
Kohmura et al.

[11] Patent Number: 5,956,237
[45] Date of Patent: *Sep. 21, 1999

[54] PRIMARY PRINTED WIRING BOARD

[75] Inventors: Toshimi Kohmura; Yasuhiro Horiba; Hisao Kato, all of Ogaki, Japan

[73] Assignee: IBIDEN Co., Ltd., Gifu, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/663,256

[22] PCT Filed: Dec. 22, 1994

[86] PCT No.: PCT/JP94/02197

§ 371 Date: Jun. 24, 1996

§ 102(e) Date: Jun. 24, 1996

[87] PCT Pub. No.: WO95/18522

PCT Pub. Date: Jul. 6, 1995

[30] Foreign Application Priority Data

Dec. 24, 1993 [JP] Japan ..................................... 5-347957

[51] Int. Cl.⁶ ..................................................... H05K 1/18
[52] U.S. Cl. .......................... 361/784; 361/813; 361/772; 361/807; 361/809; 361/764; 257/690; 257/692; 257/735; 257/782; 174/52.1
[58] Field of Search ..................................... 361/784, 750, 361/751, 753, 757, 762, 772, 807, 765, 763, 764, 767, 679, 683, 686, 748, 760, 778, 813, 809; 257/690, 691, 692, 698, 724, 735, 773, 774, 782; 174/52.1, 52.4; 228/180.21, 180.22

[56] References Cited

U.S. PATENT DOCUMENTS

| | | | |
|---|---|---|---|
| 3,821,847 | 7/1974 | Melse et al. | 29/624 |
| 4,134,801 | 1/1979 | Hofer et al. | 204/15 |
| 5,036,380 | 7/1991 | Chase | 257/668 |
| 5,274,197 | 12/1993 | Kondo et al. | 174/267 |
| 5,389,739 | 2/1995 | Mills | 174/52.4 |

FOREIGN PATENT DOCUMENTS

| | | |
|---|---|---|
| 0 468 275 | 1/1992 | European Pat. Off. . |
| 38 09 005 | 9/1989 | Germany . |
| 61-090453 | 5/1986 | Japan . |
| 1-21573 | 6/1989 | Japan . |
| 2-84361 | 6/1990 | Japan . |
| 3-009543 | 1/1991 | Japan . |
| 5-15318 | 3/1993 | Japan . |

Primary Examiner—Leo P. Picard
Assistant Examiner—David Foster
Attorney, Agent, or Firm—Bacon & Thomas, PLLC

[57] ABSTRACT

A primary printed wiring board includes: secondary printed wiring boards arranged in plural lines; main plated leads formed between the plural lines of secondary printed wiring boards; and auxiliary plated leads which connect patterns forming the secondary printed wiring boards to the main plated leads. In the primary printed wiring board, each main plated lead is zig-zagged to provide forward lines and backward lines which are laid respectively on both sides of a cutting line with respect to the pattern, and the auxiliary plated leads are connected to the backward lines.

With the primary printed wiring board thus designed, the auxiliary plated leads can be isolated from one another without being processed by blanking. That is, by cutting the board along a predetermined cutting line or lines, the auxiliary plated leads can be separated from the main plated leads and isolated from one another.

9 Claims, 10 Drawing Sheets

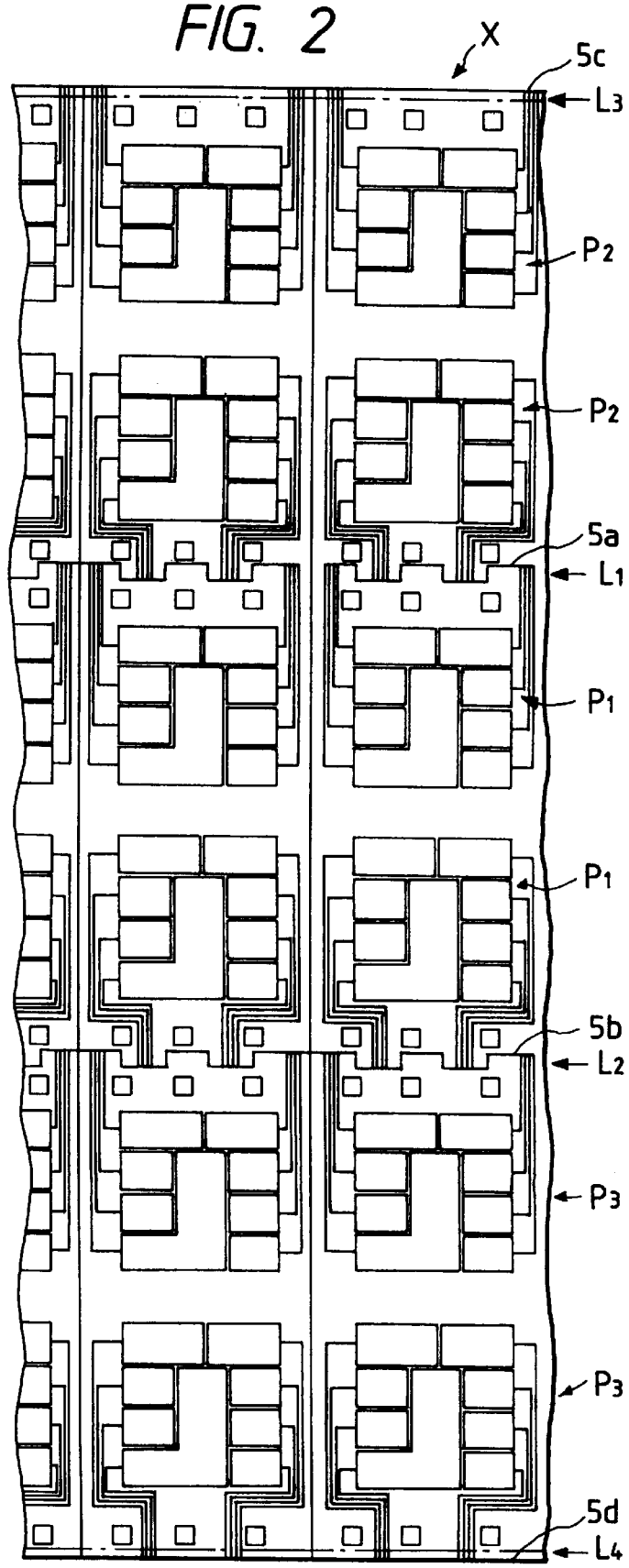

PRIMARY PRINTED WIRING BOARD

TECHNICAL FIELD

This invention relates to primary printed wiring boards from which secondary printed wiring boards (hereinafter referred to as "printed wiring boards" or "desired printed wiring board", when applicable) are obtained, and more particularly to a primary printed wiring board with which electronic components can be inspected readily and positively.

RELATED ART

In a conventional primary printed wiring board, as shown in FIG. 14, a plurality of (eight) auxiliary plated leads (43, 44, and so on) are connected to contact terminals (33, 34 and so on) forming a predetermined contact pattern P, and further connected collectively to the collecting parts 51a of a main plated lead 5. FIG. 15 shows another conventional primary printed wiring board comprising a substrate 1 on which a plurality of leads (61 and so on) are formed. The free ends (611 etc.) of those leads are connected to an electronic component 10 which is mounted on the board. The auxiliary plated leads (41 etc.) are connected to the other ends 62 of lead 61. The auxiliary plated leads are collectively connected to four collecting parts (51) of the main plated leads 5a and 5b, and the leads are electrically connected to one another (see Examined Japanese Patent Application Publication No. 14225/1992).

The collecting parts 51 are formed by blanking (cutting material using a die). at 52a as shown in FIG. 16. Hence, the auxiliary plated leads are separated from one another, and contact terminals forming adjacent contact patterns or lead patterns ($P_1$ and $P_2$), or the auxiliary plated leads connected to the main leads, are also electrically isolated from one another. A testing contactor is brought into contact with the contact terminals or leads, so as to determine whether or not the electrical component is satisfactory as is well known in the art (see Examined Japanese Patent Application Publication No. 14225/1992).

However, the above-described conventional printed wiring board suffers from the following difficulties: (1) In order to form openings by blanking, it is necessary to provide a metal die for every contact pattern, which results in an increase in manufacturing cost. (2) Being formed by blanking, the resultant products (printed wiring boards) are liable to be cracked or dented. That is, the blanking operation is one of the factors which adversely affect the products. (3) The blanking operation is carried out in the final stage where the product is highest in value added, and therefore the potential loss is greatest at this stage.

An object of the invention is to solve the above described problems associated with a conventional primary printed wiring board. More specifically, an object of the invention is to provide a primary printed wiring board which is advantageous as follows: It can be manufactured without use of a tool for insulation and isolation; that is, it can be formed independently of various specific contact patterns (layouts), so that the printed wiring board is less damaged when compared with the conventional one. The pattern forming effective area is wide, and the main plated leads can use common leads, and the electrical components mounted on the board can be inspected readily and positively.

BRIEF SUMMARY OF THE INVENTION

A primary printed wiring board according to the invention comprises: secondary printed wiring boards arranged in plural lines; main plated leads formed between the plural lines of secondary printed wiring boards; and auxiliary plated leads which connect patterns forming the secondary printed wiring boards to the main plated leads.

In the primary printed wiring board according to the invention, each main plated lead is zigzagged to provide "forward" or proximal lines and "backward" or distal lines which are laid respectively on both sides of a predetermined cutting line with respect to the contact pattern, and the auxiliary plated leads are connected to the backward lines.

A primary printed wiring board according to the invention also comprises: a printed wiring board substrate; at least two bonding hole patterns which are located adjacent to each other and are each made of a plurality of bonding holes formed around an electronic component accommodating/mounting position on the substrate; at least-two contact patterns provided in correspondence with the bonding hole patterns, the contact pattern being located adjacent to each other and each made up of a plurality of contact terminals which are formed on one side of the substrate and are connected through bonding wires to an electronic component mounted on the substrate; a plurality of auxiliary plated leads connected to the contact terminals; and one or more main plated leads to which the auxiliary plated leads are connected.

In the primary printed wiring board thus organized, according to the invention, each main plated lead 5 is zigzagged to provide forward lines and backward lines which are located closer to or further away from, respectively, a contact pattern made up of the plurality of contact terminals, the auxiliary plated leads being connected to the backward lines, and when the primary printed wiring board is cut along one predetermined cutting line on both sides of which the forward lines and the backward lines are located, the auxiliary plated leads are separated not only from one another, but also from other auxiliary plated leads connected to other contact terminals which form contact patterns adjacent thereto.

A primary printed wiring board according to the invention also comprises: a printed wiring board substrate; at least two bonding hole patterns which are located adjacent to each other and are each made of a plurality of bonding holes formed around an electronic component accommodating/mounting position on the substrate; at least two contact patterns provided in correspondence with the bonding hole patterns, the contact patterns being located adjacent to each other and each made up on a plurality of contact terminals which are formed on one side of the substrate and are connected through bonding wires to an electronic component mounted on the substrate; a plurality of auxiliary plated leads connected to the contact terminals; and one or more main plated leads to which the auxiliary plated leads are connected.

In the primary printed wiring board thus organized, according to the invention, each main plated lead is linear; the auxiliary plated leads are connected to the main plated lead, and when the primary printed wiring board is cut along two predetermined cutting lines, which are laid in parallel with each linear main plated lead and on both sides of the main plated leads, the auxiliary plated leads are separated not only from one another, but also from other auxiliary plated leads which are connected to other contact terminals which form contact patterns adjacent thereto.

A primary printed wiring board according to the invention also comprises: a printed wiring board substrate; at least two lead patterns which are arranged adjacent to each other and are each made up of a plurality of leads having free ends which are connected to an electronic component mounted on one side of the substrate; a plurality of auxiliary plated leads which are connected to the remaining ends of the leads; and one or more main plated leads to which the plurality of auxiliary plated leads are connected.

In the primary printed wiring board thus organized, according to the invention, each main plated lead is zigzagged to provide forward lines and backward lines which extend closer to or further away from, respectively, a lead pattern made up of the plurality of contact terminals; the auxiliary plated leads are connected to the backward lines, and when the primary printed wiring board is cut along one predetermined cutting line on both sides of which the forward lines and the backward lines are located, the auxiliary plated leads are separated not only from one another, but also from other auxiliary plated leads which are connected to other contact terminals which form contact patterns adjacent thereto.

A primary printed wiring board according to the invention also comprises a wiring board substrate; at least two lead patterns which are arranged adjacent to each other and are each made up of a plurality of leads having free ends which are connected to an electronic component mounted on one side of the substrate; a plurality of auxiliary plated leads which are connected to the remaining ends of the leads; and one or more main plated leads to which the plurality of auxiliary plated leads are connected. In the primary printed wiring board thus organized, according to the invention, the main plated lead(s) are linear, the auxiliary plated leads are connected to the main plated lead(s), and when the primary printed wiring board is cut along two predetermined cutting lines, which extend in parallel with each linear main plated lead(s) and on both sides of the main plated lead(s), the auxiliary plated leads are separated not only from one another, but also from other auxiliary plated leads which are connected to other leads which form lead patterns adjacent thereto.

In a primary printed wiring board according to the invention, it is possible that the printed wiring board substrate may be belt-shaped. The primary printed wiring board, optionally being provided rolled up on a reel, may be subjected to a variety of processes.

A primary printed wiring board according to the invention concerns any one of the primary printed wiring boards described above. In the primary printed wiring boards described above, by cutting the primary printed wiring board along predetermined cutting lines, the auxiliary plated leads are isolated not only from each other, but also from auxiliary plated leads which are connected to contact terminals or leads which form contact patterns or lead patterns adjacent thereto.

A primary printed wiring board according to the above-described invention also may be belt shaped.

The primary printed wiring board of the invention has advantages. The primary printed wiring board may be cut to obtain the secondary printed wiring boards, namely, products. Predetermined electronic components may be mounted on the products at predetermined positions. Thereafter, the testing contactor may be brought into contact with the aforementioned contact terminals or leads, to determine whether or not the electronic components are satisfactory.

In the case where the main plated lead or leads of the primary printed wiring board is zigzagged, the primary printed wiring board main plate may be cut along one cutting line which corresponds to the central axis of the zigzagged main plated lead(s). In the case where the main plated lead(s) of the primary printed wiring board is (are) straight, the primary printed wiring board may be cut along two cutting lines which are laid on both side of the straight main plated lead. Hence, the auxiliary plated leads connected to the main plated lead(s) are separated from one another, and isolated from auxiliary plated leads which are connected to the contact terminals (or leads) forming contact terminal patterns (or lead patterns) adjacent thereto.

Hence, with the primary printed wiring board of the invention, it is unnecessary to perform a blanking operation. In addition, the cutting operation can be carried out independently of the kinds of contact patterns (or lead patterns); that is, merely by cutting the primary printed wiring board along the predetermined cutting line or lines, the auxiliary plated leads are separated from one another and from other auxiliary plated leads adjacent thereto.

As was described above, the secondary printed wiring boards are obtained by cutting the primary printed wiring board, and the cutting method scarcely damages the secondary printed wiring boards. In the secondary printed wiring boards, the contact terminals or leads are positively separated from one another. Therefore, when predetermined electronic components are mounted thereon, the testing contactor can be brought into contact with them, to determine whether or not the electronic components are acceptable.

BRIEF DESCRIPTION OF THE DRAWINGS

FIG. 2 is a plan view showing part of the primary printed wiring board illustrated in FIG. 1;

DETAILED DESCRIPTION OF PREFERRED EMBODIMENTS OF THE INVENTION

The invention will be described in detail with reference to the preferred embodiments.

First Preferred Embodiment

Figure 1:
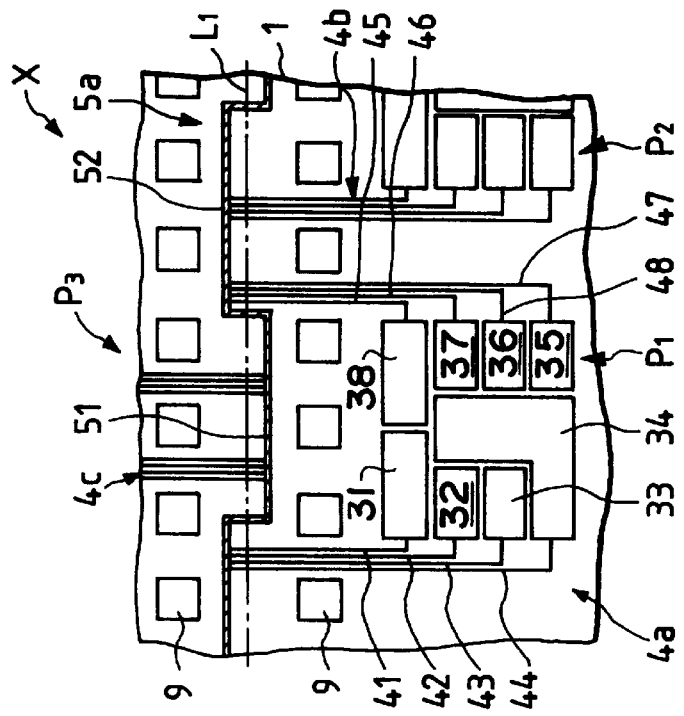
FIG. 1 is an enlarged plan view showing essential portions of a primary printed wiring board having contact patterns, and which constitutes a first embodiment of the invention.

A primary printed wiring board for producing secondary printed wiring boards, which constitutes a first embodiment of the invention, is as shown in FIG. 1 (an enlarged plan view showing essential components thereof); FIG. 2 (a plan view of contact patterns arranged in three lines, showing part of the substantially whole structure of the board) and FIG. 3 (a sectional view showing essential portions). That is, the primary printed wiring board has predetermined contact patterns and zigzagged main plated leads.

(1) Structure of the primary printed wiring board

Figure 3:
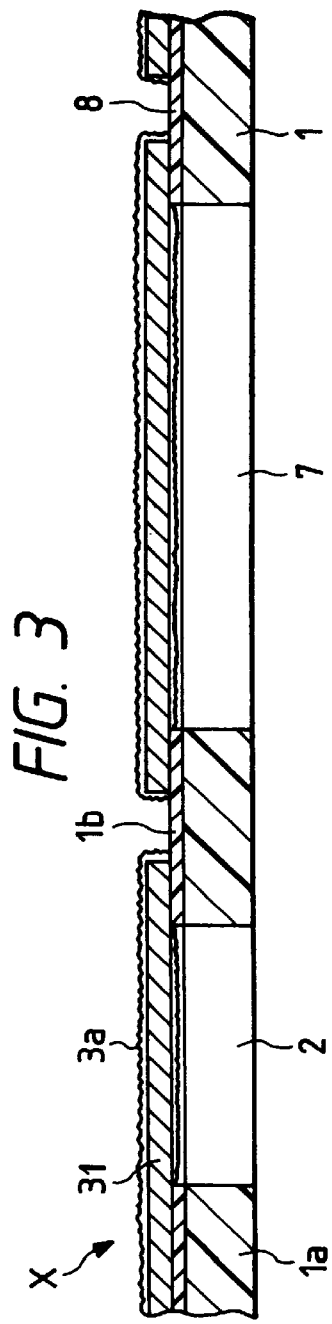
FIG. 3 is a sectional view of part of the primary printed wiring board shown in FIG. 1.

As shown in FIGS. 1, 2, and 3 the primary printed wiring board X comprises: a substrate 1; at least two hole patterns including holes 2 (FIG. 2) which are adjacent to one another; and extend through substrate at least two contact patterns ($P_1$, $P_2$, $P_3$) including terminals 31–38 provided in correspondence with and above the hole patterns; auxiliary plated leads 41–48; main plated leads 5a–5d, and sprocket holes 9.

The substrate 1 is 100 μm in thickness, and it is made of glass epoxy; however, the invention is not limited thereto or thereby. For instance, it may be formed by using polyester or polyimide.

Each hole pattern includes a plurality of holes (2) which are provided around an electronic component accommodating/mounting region (position) 7 (FIG. 3) provided on the substrate (for instance six, eight or twelve circular holes 0.8 mm in diameter). A number of those hole patterns 2 are arranged in matrix form, vertically and horizontally to correspond with the locations of the terminals 31–38 of a pattern $P_1$, $P_2$ and $P_3$.

Each aforementioned contact terminal pattern is made up of a plurality of terminals (31–38) which are formed on one side (contact surface) of the substrate 1, and are connected via the aforementioned holes 2 with bonding wires to an electronic component mounted on the substrate. The terminals thus arranged form contact patterns $P_1$–$P_3$. Contact patterns (e.g., 12.8 mm in widthwise direction, and 13.8 mm in lengthwise direction) $P_1$, $P_2$ and $P_3$ each consisting of the contact terminals 31–38 as shown in FIG. 1 in detail, and a series of those contact patterns as shown in FIG. 2. In FIG. 2, a section of the contact patterns $P_1$–$P_3$ is shown. As a full pattern, as viewed in the widthwise direction of the board (vertically in FIG. 2), contact patterns $P_1$ etc. are arranged in six horizontal lines [120 mm in widthwise direction (35 mm in width, in three lines)]. Those contact patterns P are thus arranged as shown in FIG. 2, thus providing three groups of combined contact patterns $P_1$ etc., which groups are arranged in three horizontal parallel lines. More specifically, the groups of contact patterns $P_1$, $P_2$ and $P_3$ are arranged adjacent to one another in correspondence with the bonding hole patterns.

As seen in FIG. 3, a typical contact terminal 31 is made of a sheet of copper foil 18 μm, 35 μm or 70 μm in thickness that is bonded to the contact surface 1b of the substrate 1 with an adhesive agent (about 20 gm in the thickness of adhesive agent layer). In order to protect the contact terminal, a gold- or nickel-plated layer 3a is formed on the surface of the latter.

The aforementioned auxiliary plated leads 41 through 48 (eight leads per contact pattern) are connected to contact terminals 31 through 38, respectively. Those leads 41 through 48 are connected to one main plated lead 5a (FIG. 1).

For instance, as shown in FIG. 1, the main plated lead 5a extends zigzagged with respect to the group of contact patterns $P_1$, including forward lines 51 (closer to contact pattern $P_1$) and backward lines 52 (further away from contact pattern $P_1$). In this embodiment, three groups of combined contact patterns are arranged in three lines (one group in one line). Hence, two main plated leads 5a and 5b (FIG. 2) which are zigzagged are provided in the middle of the primary printed wiring board; and two other main plated leads 5c and 5d which are linear (not zigzagged) are provided along the edges of the board. The auxiliary plated leads 41 through 48 are divided into two groups, and are connected to the backward lines 52. A group of auxiliary plated leads 4c, which are connected to the contact pattern $P_3$ arranged in the widthwise direction and adjacent the contact pattern $P_1$, are connected to the forward line of the main plated lead 5a. A group of auxiliary plated leads 4b, which are connected to the contact pattern $P_2$ which is arranged adjacent to the contact pattern $P_1$, are connected to the backward line 52 of the zigzagged main plated line 5.

The openings 7 for the aforementioned electronic component accommodating/mounting regions and holes 2 are formed by blanking the substrate 1 with a metal die. The contact patterns—($P_1$ etc.) may be formed as follows: A copper foil is bonded onto the substrate with adhesive agent, and then subjected to etching. In addition, the plated layer 3a is formed over the contact terminals as follows: the contact terminals are subjected to plating through the main plated leads and auxiliary plate leads under predetermined conditions.

(2) Division of the Primary printed wire board by cutting

Figure 8:
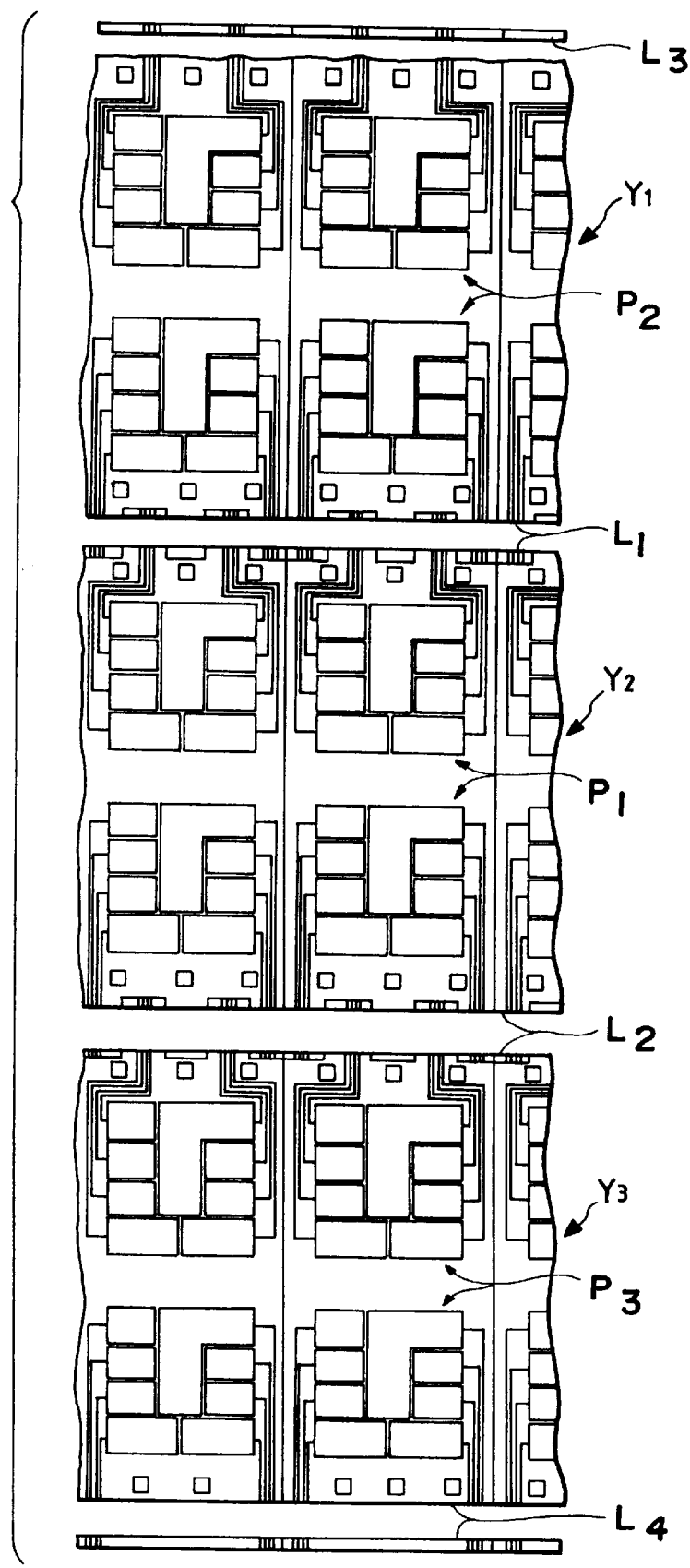
FIG. 8 is a plan view showing a part of the primary printed wiring board shown in FIG. 2 which has been cut.

A primary printed wiring board X (FIG. 2) includes three groups of combined contact patterns ($P_1$ and $P_1$, $P_2$ and $P_2$, and $P_3$ and $P_3$). The board X is cut along predetermined cutting lines $L_1$ and $L_2$ which extend along (i.e., parallel to) the axial lines of the zigzagged main plated leads 5a and 5b, respectively, and then along predetermined cutting lines L3 and L4 extending along the main plated leads 5c and 5d at both edges, to separate the latter leads 5c and 5d from the board body. As a result, three secondary printed wiring boards $Y_1$ $Y_2$ and $Y_3$ as partially shown in FIG. 8 have been formed. Hence, by cutting the printed wiring board X in the above-described manner, the auxiliary plated leads connected to the main plated leads are electrically separated from one another, and the auxiliary plated leads connected to the contact terminals forming the contact patterns are also electrically separated from one another.

(3) Effects of the first embodiment, and Electrical test method

In the first embodiment, merely by cutting the primary printed wiring board X along the predetermined cutting lines, the auxiliary plated leads can be separated from one another; that is, the desired printed wiring boards are obtained without the blanking operation which may damage the printed wiring boards. Electronic components (such as semiconductor chips) are arranged on the resultant product at predetermined positions, and the connecting terminals of those electronic components are connected to the contact terminals with bonding wires. Thereafter, with the testing contactor brought into contact with the contact terminals, it can be determined whether or not the electronic components are acceptable. That is, in determining whether or not the electronic components are satisfactory, the latter will never be damaged. Furthermore, as was described above, in the first embodiment, the primary printed wiring board X is not subjected to blanking; that is, the printed wiring boards are obtained by merely by cutting the primary printed wiring board along the predetermined cutting lines. Hence, independently of the configuration of the contact patterns of the primary printed wiring board, the auxiliary plated wires can be electrically separated from one another.

In the printed wiring board thus processed, the main plated leads are not present; or they are located outside of the lines of sprocket holes, so that the pattern effective area is increased by as much.

Second Embodiment

In a second embodiment of the invention, according to another aspect of the latter, its main plated leads, auxiliary plated leads, and contact pattern are modified in various manners.

Figure 4:
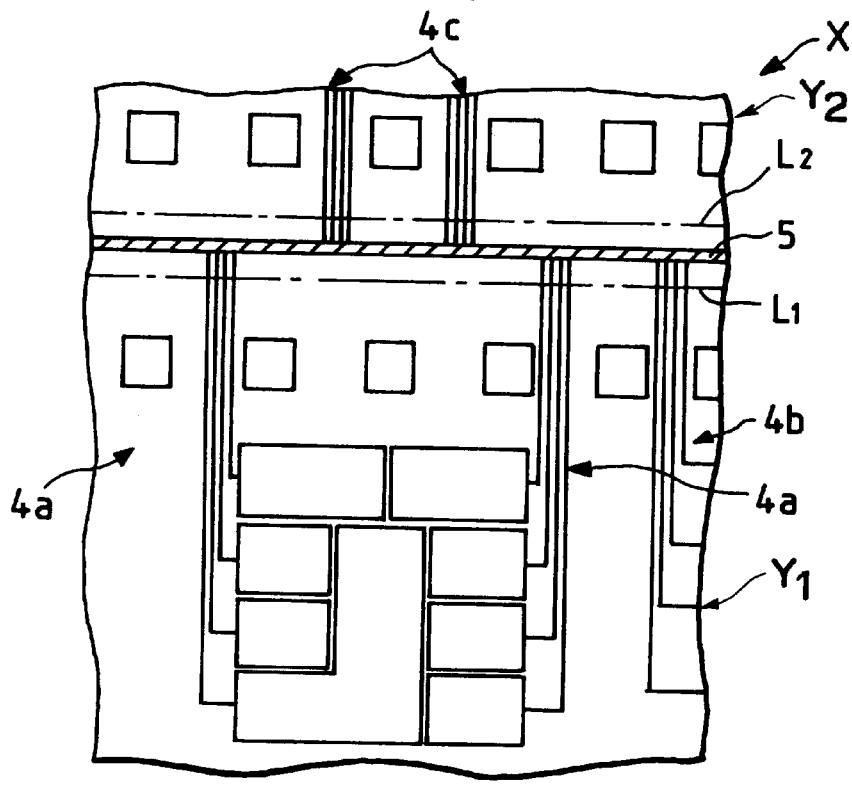
FIG. 4 is an enlarged plan view showing essential portions of an example of a primary printed wiring board having a linear main plated lead, and which constitutes a second embodiment of the invention.
Figure 9:
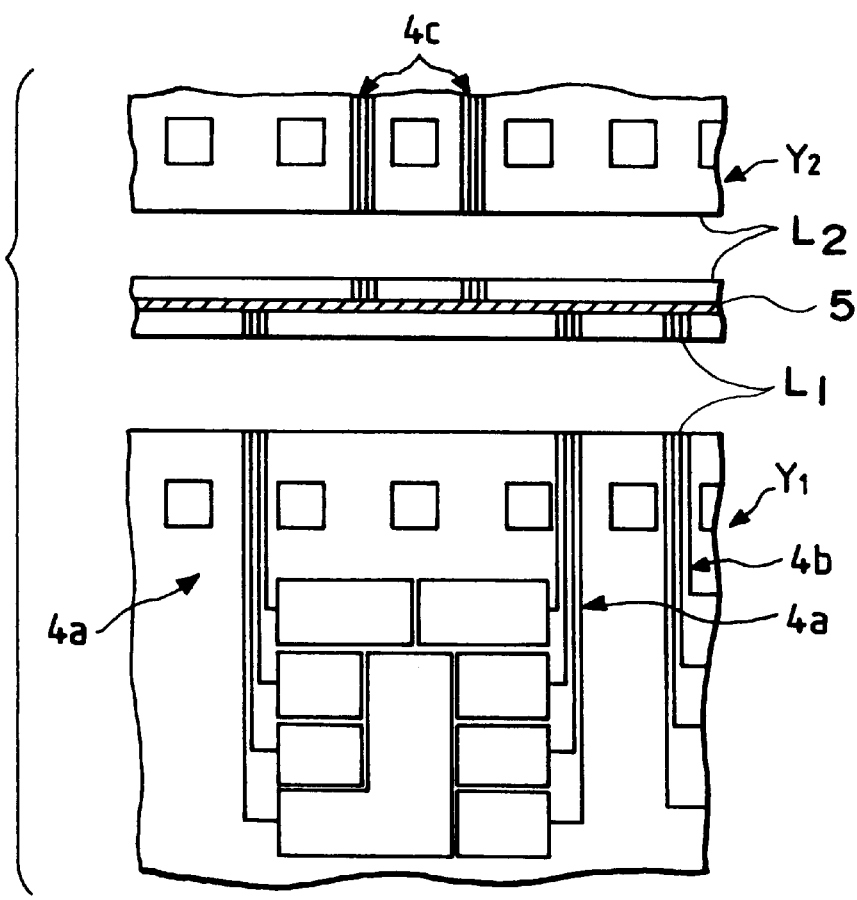
FIG. 9 is a plan view showing part of the primary printed wiring board shown in FIG. 4 which has been cut.

In the second embodiment, as shown in FIG. 4, a primary printed wiring board X has a straight (linear) main plated lead 5. In the board X, two cutting lines $L_1$ and $L_2$ are provided on both sides of the main plated lead 5 in such a manner that the former are in parallel with the latter. More specifically, the cutting line $L_1$ is on one side of the main plate lead 5, and the cutting line $L_2$ is on the other side of the lead 5. By cutting the primary printed wiring board X along those cutting lines $L_1$ and $L_2$, two printed wiring boards $Y_1$, and $Y_2$ are formed as shown in FIG. 9. In the second embodiment, similarly as in the first embodiment, the groups of auxiliary plated leads 4a and 4a extending from one and the same contact pattern are separated not only from each other, but also from the groups of auxiliary plated leads 4b and 4c of contact patterns adjacent thereto.

Figure 5:
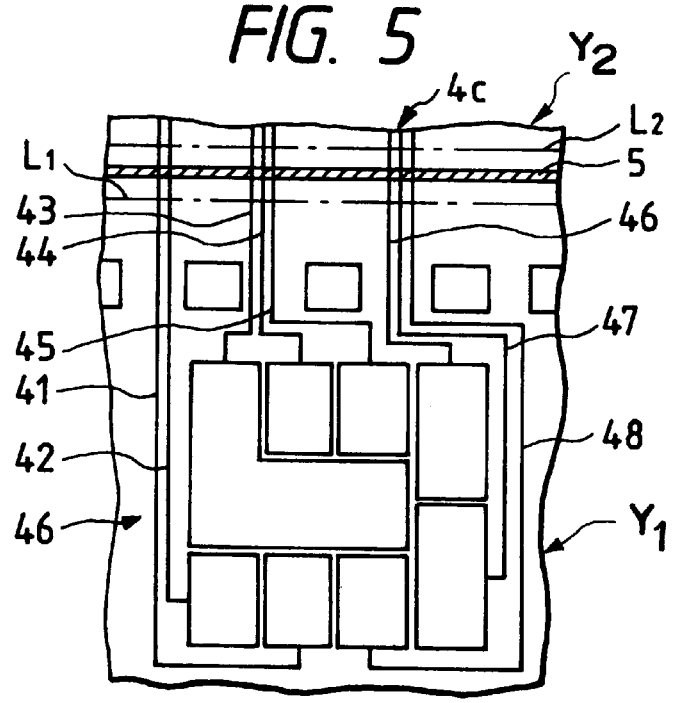
FIG. 5 is an enlarged plan view showing essential portions of another example of a primary printed wiring board according to the second embodiment, which has a linear main plated lead, and which is different in the configuration of auxiliary plated leads and contact patterns from the primary printed wiring board shown in FIG. 4.

In the case of FIG. 5, the primary printed wiring board has a straight main plated lead 5; however, it is different from the above-described one in the arrangement of auxiliary plated leads 41 through 48 connected to the main plated lead 5, and in the arrangement of groups of auxiliary plated leads 4c extending from a contact pattern adjacent thereto in widthwise direction. In this case, too, by cutting the primary printed wiring board along two cutting lines $L_1$ and $L_2$, secondary printed wiring boards can be manufactured.

Figure 6:
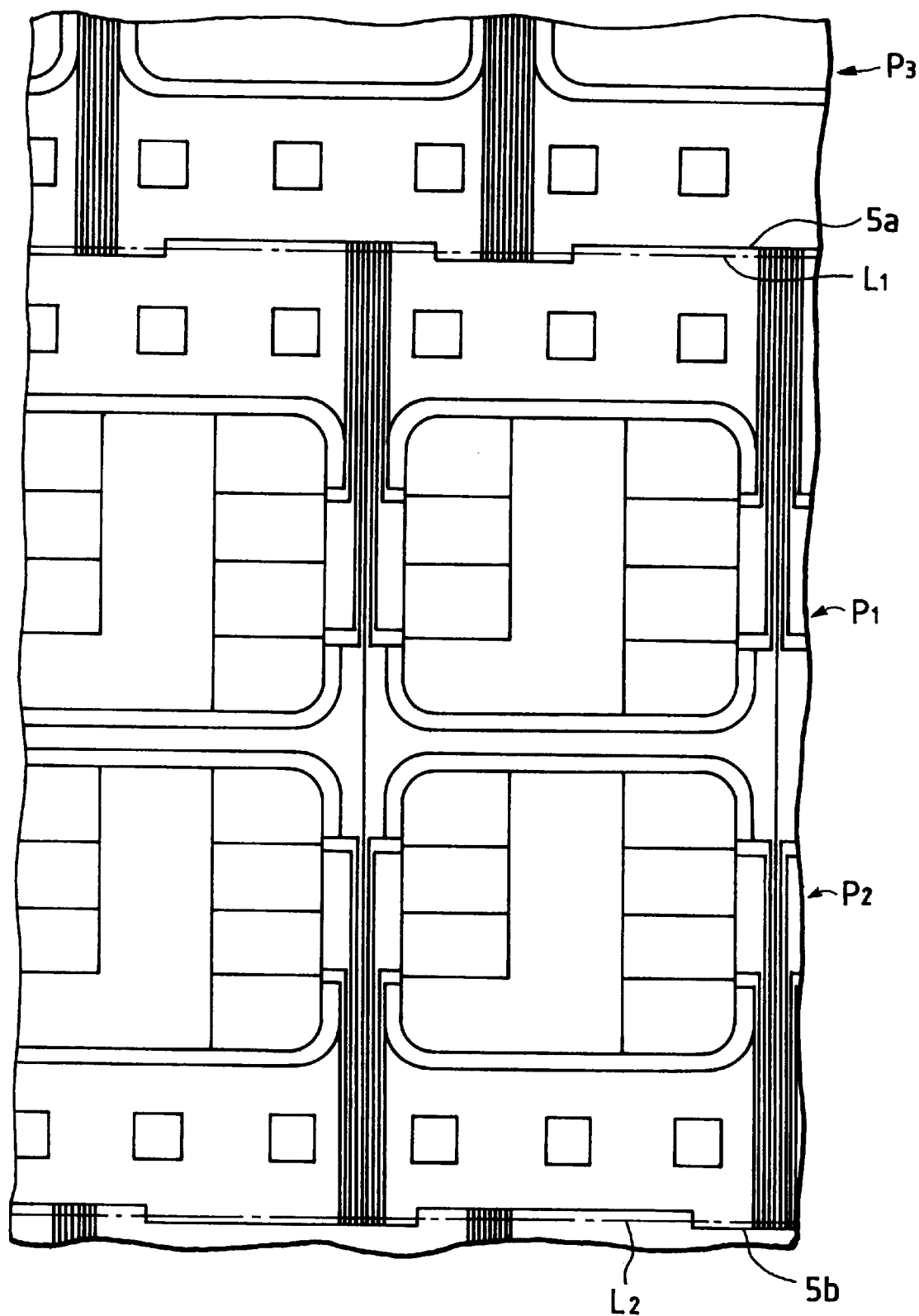
FIG. 6 is an enlarged plan view showing an essential portion of another example of a primary printed wiring board according to the second embodiment, which has a zigzagged main plated leads, and is different in the configuration of auxiliary plated leads and contact patterns from the primary printed wiring board shown in FIGS. 4 or 5.
Figure 7:
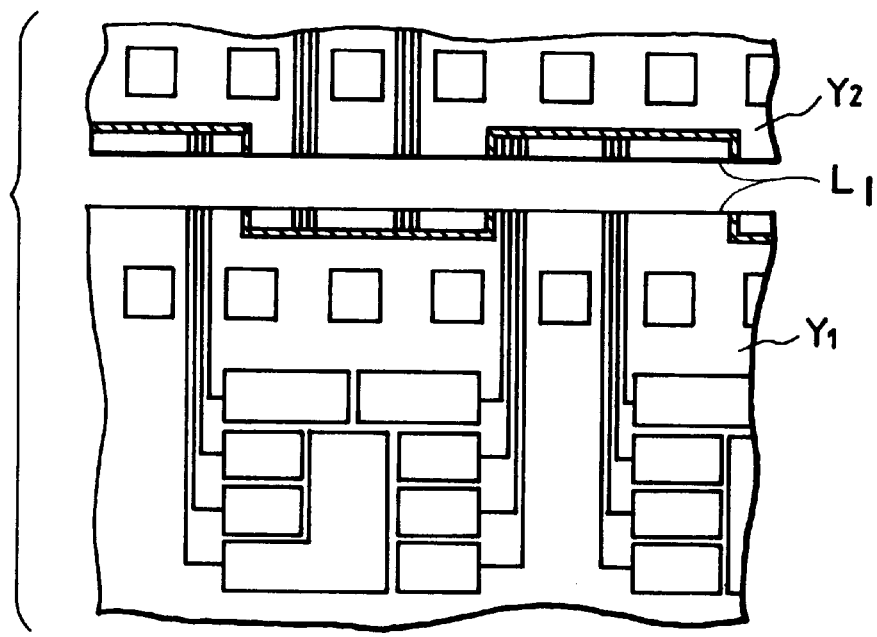
FIG. 7 is an enlarged plan view showing an essential portion of a primary printed wiring board shown in FIG. 1 which has been cut.

Further, in the example of FIG. 6, the primary printed wiring board may have zigzagged main plated leads 5a and 5b. However, in the board, groups of contact patterns ($P_1$ and $P_2$) are arranged at equal intervals (equal phase) with each other and are in alignment with each other, whereas groups of contact patterns ($P_1$ and $P_3$) which are not in equal phase with each other are shifted by as much as about half of their length from each other. Hence, all the auxiliary plated leads are simple in arrangement. In this case, too, by cutting the primary printed wiring board along two predetermined cutting lines $L_1$ and $L_2$, a plurality of secondary printed wiring boards each having two lines of contact patterns can be obtained.

The configurations and arrangements of the main plated leads, auxiliary plated leads, and contact patterns are not limited only to those which have been described above.

Third Embodiment

Figure 10:
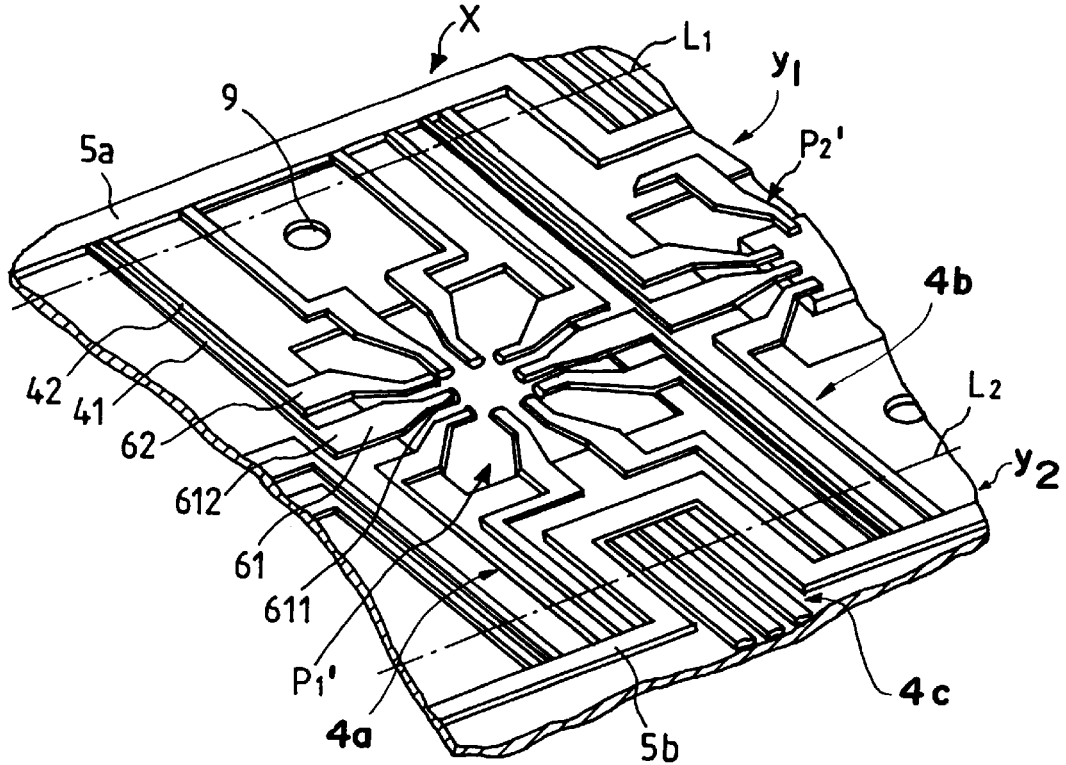
FIG. 10 is a perspective view showing part of an example of a primary printed wiring board having lead patterns, which constitutes a third embodiment of the invention.

FIG. 10 shows a primary printed wiring board X having lead patterns $P'_1$, $P'_2$ each consisting of a plurality of leads 61, 62 etc.

In this third embodiment, the primary printed wiring board X has more than two lead patterns $P'_1$, $P'_2$ etc. (two-paired lead patterns in a line as viewed in the widthwise direction), which are arranged adjacent to each other and are each made up of ten leads 61, 62 etc.; auxiliary plated leads 41, 42 etc., connected to the outer ends 612 of leads 61, 62 etc.; and main plated leads 5a, 5b etc. to which those auxiliary plated leads are connected. In FIG. 10, reference numeral 9 designates sprocket holes.

The leads (61 etc.) forming one lead pattern $P'_1$ are extended radially inwardly (toward the center). An electronic component (not shown) is mounted on the lead pattern $P'_1$, $P'_2$ etc. at the center, and is electrically connected to the free ends 611, 612 of leads 61, 62.

Similarly as in the case of the first embodiment, each of the main plated leads 5a and 5b is zigzagged, comprising forward lines and backward lines with respect to adjacent lead patterns. The five auxiliary plated leads located on the side of the rear half of the lead pattern are connected to the main plated lead 5A while the remaining five auxiliary plated leads are connected to the main plated lead 5b, in such a manner that they extend across predetermined cutting lines $L_1$ and $L_2$.

Figure 12:
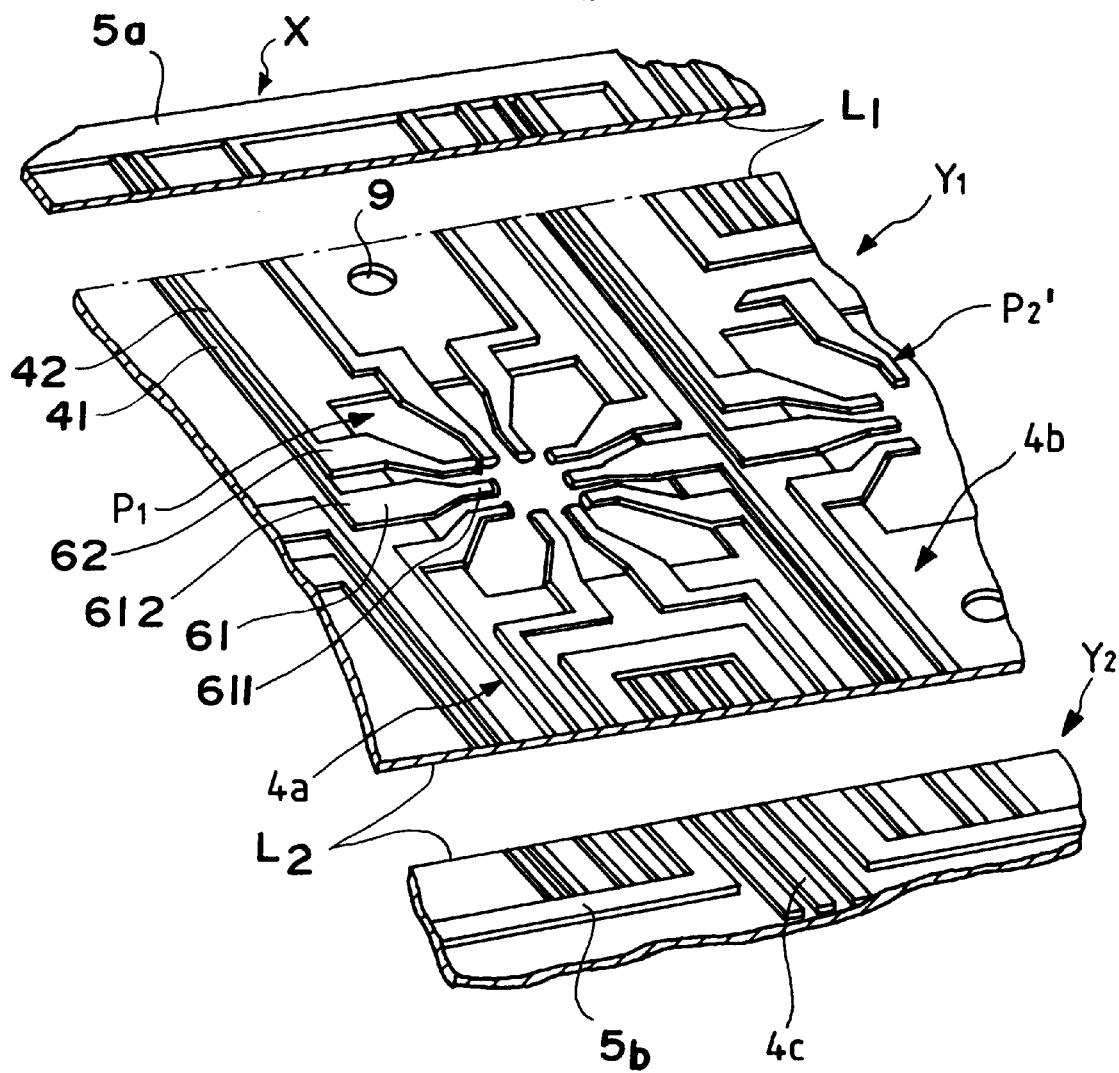
FIG. 12 is a perspective view showing part of the primary printed wiring board shown in FIG. 10 which has been cut.
Figure 13:
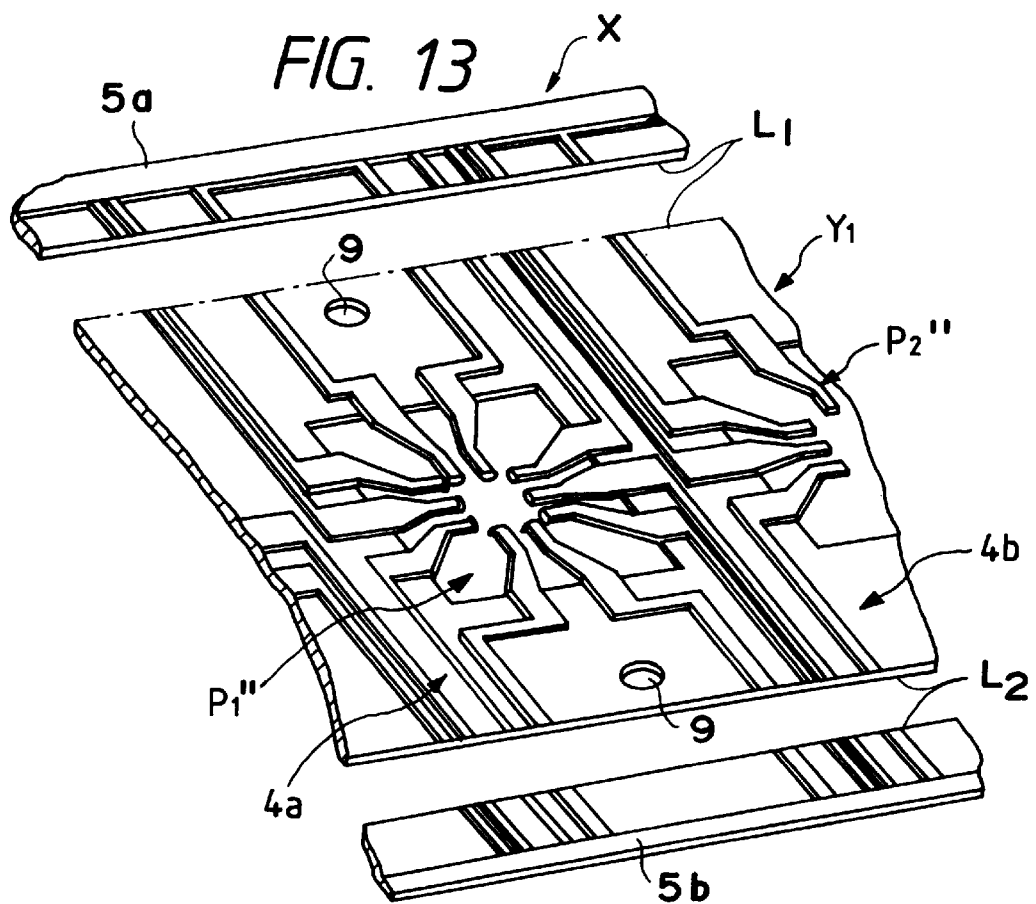
FIG. 13 is a perspective view showing part of the primary printed wiring board shown in FIG. 11 which has been cut.
Figure 14:
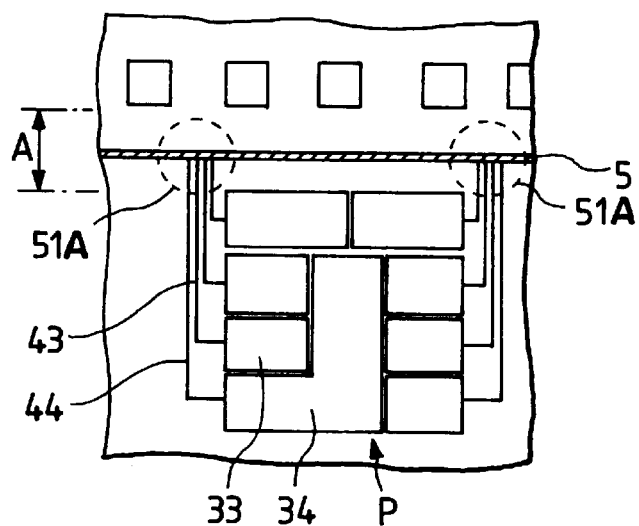
FIG. 14 is an enlarged plan view showing essential portions of a conventional primary printed wiring board having contact patterns.
Figure 15:
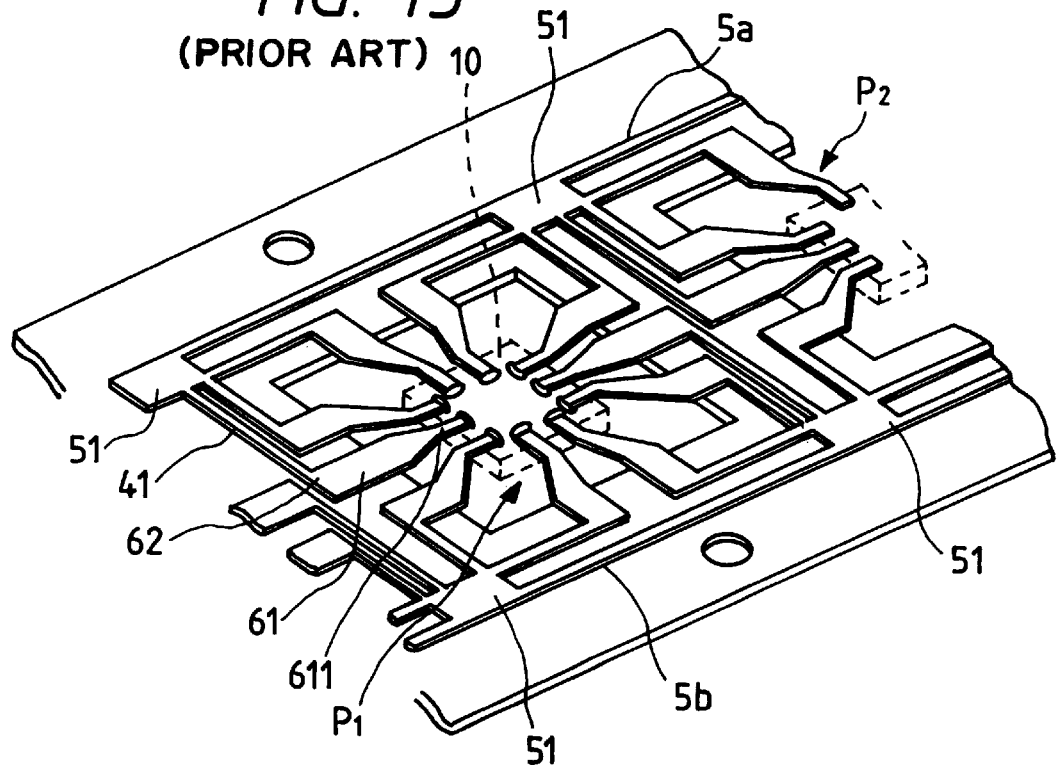
FIG. 15 is a perspective view showing part of a conventional primary printed wiring board having a lead pattern.
Figure 16:
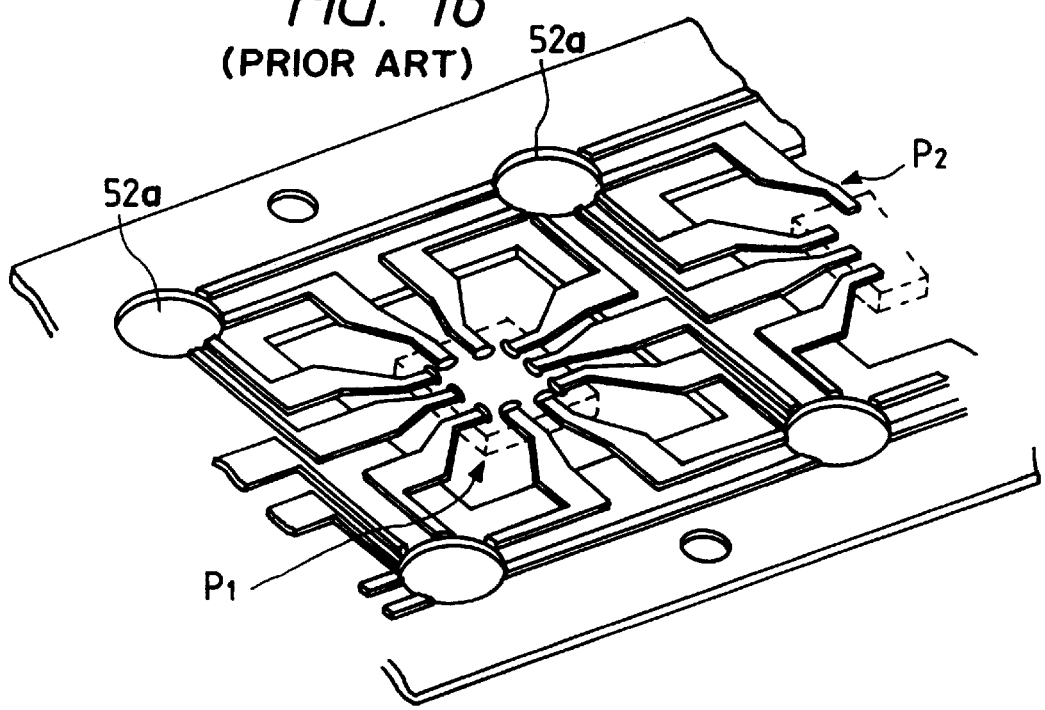
FIG. 16 is a perspective view showing part of a conventional primary printed wiring board having the lead patterns in which the collecting points of the leads have been eliminated by blanking.

By cutting the above-described primary printed wiring board along the cutting lines $L_1$ and $L_2$, two products, namely, desired printed wiring boards $Y_1$, and $Y_2$ are manufactured (see FIG. 12). In this case, similarly as in the case of the first embodiment, the auxiliary plated leads 41, 42 etc. of the lead pattern $P'_1$ are electrically separated not only from one another, but also from the groups of auxiliary plated leads of lead patterns $P'_2$ etc. adjacent thereto. In the case where the primary printed wiring board is of two groups of lead patterns, it can be divided into three parts. Also, the number of combined lead patterns forming one group may be more than two (inclusive).

Figure 11:
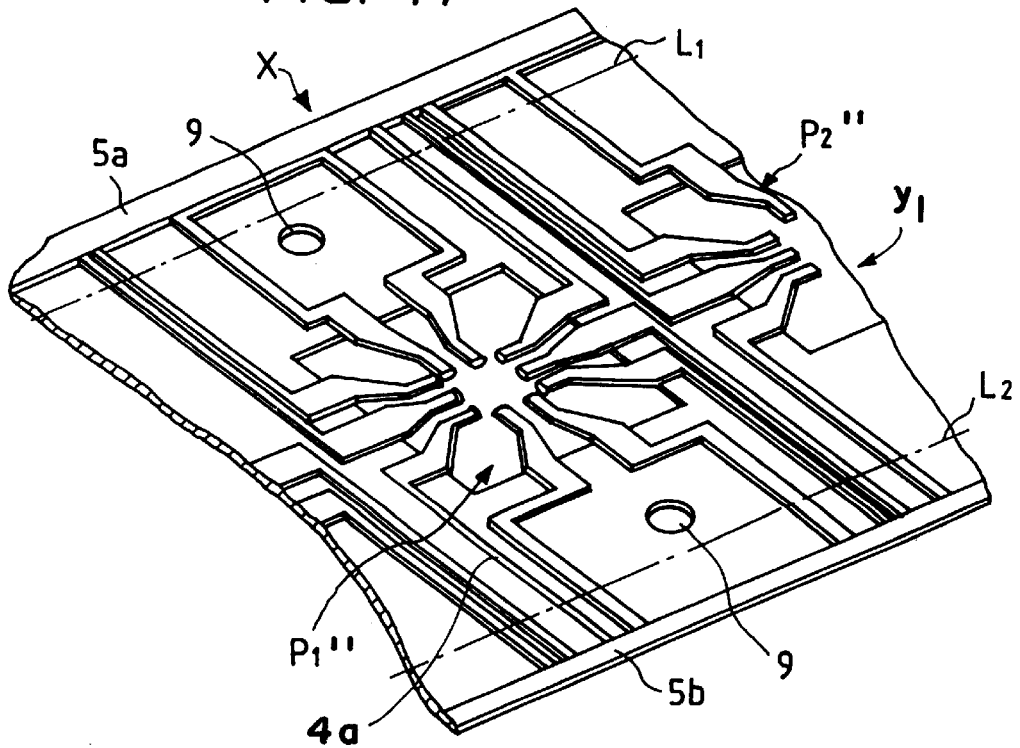
FIG. 11 is a perspective view showing part of another example of the primary printed wiring board according to the third embodiment.

In the case of FIG. 11, a primary printed wiring board X is such that it has straight main plated leads 5a and 5b, and its lead patterns are in one line as viewed in the widthwise direction. In this case, too, by cutting the board X along cutting lines $L_1$, and $L_2$, one product, namely, a printed wiring board $Y_1$, can be manufactured. In addition, the auxiliary plated leads 4a of the lead pattern $P''_1$ are separated not only from one another, but also from the auxiliary plated leads 4b of the lead pattern $P''_2$ adjacent thereto.

While preferred embodiments of the invention have been described, it will be obvious to those skilled in the art that various changes and modifications may be made therein without departing from the invention. That is, the contact terminals or leads may be changed in number, in configuration, and in arrangement. In addition, the number and size of contact patterns or lead patterns may be modified as desired. Furthermore, the number, size, configuration, and arrangement of the contact bonding holes may be suitably selected. For instance, with respect to the arrangement of the contact patterns, the number of contact terminals of each contact pattern, the number of combined contact patterns as viewed in the widthwise direction, the number of contact patterns as viewed in the lengthwise direction, are not limited to those which have been described with reference to the preferred embodiments. Furthermore, in the above-described embodiments, the main plated leads are zigzagged or formed like a flight of stairs (partially rectangular); however, the invention is not limited thereto or thereby. That is, all that is necessary for the zigzagged main plated lead is that the forward lines and the backward lines are connected alternately to each other. Unitary configurations forming a main plated lead may be triangular, trapezoid, or elliptic, and the number of pitch and the depth of pitch of those unitary configurations are not particularly limited.

The substrate of the primary printed wiring board and its size, and the configuration and size of the electronic component mounting region may be suitably determined. For instance, although in the above-described embodiments, the substrate is shown belt-shaped, the invention is not limited thereto or thereby; that is, the substrate may be a short one. Furthermore, in the above-described embodiments, the electronic component mounting region is recessed to accommodate the electronic component; however, the invention is not limited thereto or thereby. That is, the electronic component may be mounted on a predetermined flat surface of the base material.

In the manufacture of the printed wiring boards according to the invention, it is unnecessary to perform a blanking operation to obtain electrical insulation and isolation of the auxiliary plated leads. That is, merely by cutting the primary printed wiring board along the predetermined cutting lines, the auxiliary plated leads can be separated from the main plated leads, and isolated from one another. Hence, the printed wiring board of the invention has the following advantages:

(1) Preparation of a cutting tool is independent of the kinds of contact patterns or lead patterns; that is, a cutting tool can be prepared that merely corresponds with the configuration and dimension of the printed wiring board; in other words, one and the same cutting tool can be used for all kinds of contact patterns or lead patterns.

(2) When manufactured, the products are scarcely damaged. That is, the secondary printed wiring boards are scarcely adversely affected when the primary printed wiring board is cut.

(3) The positions of the cutting lines on the primary printed wiring board are clear. If they are shifted, it can be even visually detected from the positional relationships between the main plated leads and the auxiliary plated leads.

(4) When the primary printed wiring board is cut to obtain the desired printed wiring boards, the main plated leads are removed therefrom, and hence the pattern forming effective area is increased as much. In a conventional board, the product includes the main plated lead, and that region cannot be utilized for the formation of lead patterns.

(5) The main plated lead is employed as a common lead, so that the unwanted plated area other than that for the products is decreased. This feature contributes greatly to a decrease of the manufacturing cost especially when gold plating is employed.

We claim:

1. A primary printed wiring board comprising:

secondary printed wiring boards arranged in plural lines;

main plated leads formed between said plural lines of secondary printed wiring boards;

a plurality of contact patterns formed on said secondary printed wiring boards;

auxiliary plated leads connecting said contact patterns to said main plated leads;

each main plated lead being zig-zagged to provide proximal main plated lead lines and distal main plated lead lines relative to adjacent contact patterns on adjacent secondary printed wiring boards extending in separate lines and which extend on both sides of a predetermined cutting line that extends between contact patterns of adjacent secondary printed wiring boards extending in separate lines, and said auxiliary plated leads of each contact pattern being connected to said lines of the main plated leads that are distal relative to the respective contact pattern from which the auxiliary plated leads extend.

2. A primary printed wiring board comprising:

a printed wiring board substrate;

at least two hole patterns in the substrate which are located adjacent to each other and are each made of a plurality of holes formed around an electronic component accommodating/mounting position on said substrate;

at least two contact patterns provided in correspondence with said hole patterns;

said contact patterns being located adjacent to each other and each made up of a plurality of contact terminals which are formed on one side of said substrate and are electrically connected to an electronic component mounted on said substrate;

a plurality of auxiliary plated leads connected to said contact terminals;

at least one main plated lead to which said auxiliary plated leads are connected;

said at least one main plated lead being zig-zagged to provide proximal main plated lead lines and distal main plated lead lines which respectively extend closer to and further away from said contact pattern such that when said primary printed wiring board is cut along a predetermined cutting line on opposed sides of which said proximal lines and said distal lines are respectively located, said auxiliary plated leads are electrically separated not only from one another, but also from at least one other auxiliary plated lead which is connected to another contact terminal comprising another contact pattern located adjacent the cutting line.

3. A primary printed wiring board comprising:

a printed wiring board substrate;

at least two hole patterns in the substrate which are located adjacent to each other and are each made of a plurality of holes formed around an electronic component accommodating/mounting position on said substrate;

at least two contact patterns provided in correspondence with said hole patterns, said contact patterns each being located adjacent to each other and each made up of a plurality of contact terminals which are formed on one side of said substrate and are electrically connected to an electronic component mounted on said substrate;

a plurality of auxiliary plated leads connected to said contact terminals; and at least one main plated lead to which at least one of said auxiliary plated leads are connected;

said at least one main plated lead being linear;

said auxiliary plated leads being connected to said at least one main plated lead such that when said primary printed wiring board is cut along two predetermined cutting lines which extend in parallel with said at least one linear main plated lead and on both sides of said at least one linear main plated lead, said auxiliary plated leads are electrically separated not only from one another, but also from auxiliary plated leads which are connected to other contact terminals which comprise other contact patterns adjacent the cutting lines.

4. A primary printed wiring board comprising:

a printed wiring board substrate;

at least two lead patterns which are arranged adjacent to each other and which are each made up of a plurality of leads having free ends which are connected to an electronic component mounted on one side of said substrate;

a plurality of auxiliary plated leads which are connected to the remaining ends of said leads; and at least one main plated lead to which said plurality of auxiliary plated leads are connected;

each main plated lead being zig-zagged to provide proximal main plated lead lines and distal main plated lead lines which respectively extend closer to and further away from to said lead patterns;

said auxiliary plated lead being connected to said proximal lines such that when said primary printed wiring board is cut along a predetermined cutting line on opposed sides of which said proximal lines and said distal lines are respectively located, said auxiliary plated leads are electrically separated not only from one another, but also from other auxiliary plated leads which are connected to other contact terminals which comprise contact patterns located adjacent said cutting line.

5. A primary printed wiring board comprising:

a printed wiring board substrate;

at least two lead patterns which are arranged adjacent to each other and are each made up of a plurality of leads having free ends which are connected to an electronic component mounted on one side of said substrate;

a plurality of auxiliary plated leads which are connected to the remaining ends of said leads;

at least one main plated lead to which said plurality of auxiliary plated leads are connected, said at least one main plated lead being linear;

said auxiliary plated leads being connected to said at least one main plated lead such that when said primary printed wiring board is cut along two predetermined cutting lines which extend in parallel with said at least one linear main plated lead and on both sides of said at least one linear main plated lead, said auxiliary plated leads are electrically separated not only from one another, but also from other auxiliary plated leads which are connected to other leads which are connected to other lead patterns located adjacent said cutting lines.

6. A primary printed wiring board as claimed in any one of claims 2 through 5, wherein said printed wiring board substrate is belt-shaped.

7. A primary printed wiring board as claimed in any one of the preceding claims 1 through 5 wherein, upon separation of said primary printed wiring board along a predetermined cutting line or lines, said auxiliary plated leads are electrically isolated not only from each other, but also from auxiliary plated leads which are connected to other contact terminals or leads which comprise other contact patterns or lead patterns adjacent the cutting lines.

8. A primary printed wiring board as claimed in claim 7, in which said printed wiring board substrate is belt-shaped.

9. A primary printed wiring board as claimed in claim 8, wherein the hole patterns and contact patterns extend lengthwise along the belt-shaped printed wiring board in plural lines on opposed sides of at least one main plated lead and a predetermined cutting line or lines.

* * * * *